United States Patent [19]

Rickerby et al.

[11] Patent Number: 5,763,107
[45] Date of Patent: Jun. 9, 1998

[54] THERMAL BARRIER COATING FOR A SUPERALLOY ARTICLE

[75] Inventors: David S. Rickerby, Derby, England; Daniel K. White, New York, N.Y.; Stanley R. Bell, Herts, England

[73] Assignees: Rolls-Royce plc, London; Chromalloy United Kingdom Ltd., Nottingham, both of England

[21] Appl. No.: 819,437

[22] Filed: Mar. 17, 1997

Related U.S. Application Data

[62] Division of Ser. No. 569,480, Dec. 8, 1995, Pat. No. 5,645,893.

[30] Foreign Application Priority Data

Dec. 24, 1994 [GB] United Kingdom ............ 9426257

[51] Int. Cl.[6] .................................................. B32B 15/00
[52] U.S. Cl. .......................... 428/623; 428/629; 428/632; 428/670; 428/678; 428/633
[58] Field of Search ............................ 428/623, 629, 428/670, 678, 632, 633

[56] References Cited

U.S. PATENT DOCUMENTS

| | | |
|---|---|---|
| 3,677,789 | 7/1972 | Bungardt et al. |
| 3,692,554 | 9/1972 | Bungardt et al. |
| 3,819,338 | 6/1974 | Bungardt et al. |
| 3,961,910 | 6/1976 | Baladjanian et al. |
| 3,979,273 | 9/1976 | Panzera et al. |
| 3,999,956 | 12/1976 | Stueber et al. |
| 4,123,594 | 10/1978 | Chang |
| 4,123,595 | 10/1978 | Chang |
| 4,137,370 | 1/1979 | Fujishiro et al. |
| 4,321,310 | 3/1982 | Ulion et al. |
| 4,321,311 | 3/1982 | Strangman |
| 4,399,199 | 8/1983 | McGill et al. |
| 4,401,697 | 8/1983 | Strangman |
| 4,405,659 | 9/1983 | Strangman |
| 4,405,660 | 9/1983 | Ulion et al. |
| 4,414,249 | 11/1983 | Ulion et al. |
| 4,477,538 | 10/1984 | Clarke |
| 4,530,885 | 7/1985 | Restall |
| 4,643,951 | 2/1987 | Keem et al. |
| 4,676,994 | 6/1987 | Demaray |
| 4,722,869 | 2/1988 | Honda et al. |

(List continued on next page.)

FOREIGN PATENT DOCUMENTS

| | | |
|---|---|---|
| 57-140876 | 8/1982 | Japan |
| 6-306640 | 11/1994 | Japan |
| 1 318 609 | 5/1973 | United Kingdom |
| 2 046 369 | 11/1980 | United Kingdom |
| 2 117 269 | 10/1983 | United Kingdom |
| WO 92/05298 | 4/1992 | WIPO |
| WO 93/18199 | 9/1993 | WIPO |
| WO 94/15000 | 7/1994 | WIPO |

OTHER PUBLICATIONS

R. Lowrie, "Composite Coatings of CoCrAlY Plus Platinum", *Thin Solid Films*, 45 (1977), pp. 491–498.

Birks et al., "Introduction to High Temperature Oxidation of Metals", 1983, p. 128.

J. T. Prater et al., "Ceramic Thermal Barrier Coatings with Improved Corrosion Resistance", *Surface and Coatings Technology*, vol. 32, 1987, pp. 389–397.

A. McMinn et al., "Field Evaluation of Gas Turbine Protective Coatings", *Journal of Engineering for Gas Turbines and Power*, vol. 110, Jan. 1988, p. 142.

T. E. Stangman, "Thermal Barrier Coatings for Turbine Airfoils", *Thin Solid Films*, 127 (1985), pp. 93–105.

*Primary Examiner*—Roy V. King
*Attorney, Agent, or Firm*—Oliff & Berridge, PLC

[57] ABSTRACT

A coated article includes a superalloy substrate, an intermediate bond coat and a thermal barrier coating. The bond coat may include a platinum aluminide layer underlying a thin oxide layer. The thin oxide layer may include alumina. The coated article has high strength and durability at high temperatures over extended periods of time and thus is especially useful in the form of, e.g., a turbine blade or turbine vane.

25 Claims, 6 Drawing Sheets

U.S. PATENT DOCUMENTS

| | | |
|---|---|---|
| 4,880,614 | 11/1989 | Strangman et al. . |
| 4,916,022 | 4/1990 | Solfest et al. . |
| 5,015,502 | 5/1991 | Strangman et al. . |
| 5,180,285 | 1/1993 | Lau . |
| 5,236,745 | 8/1993 | Gupta et al. . |
| 5,238,752 | 8/1993 | Duderstadt et al. . |
| 5,350,599 | 9/1994 | Rigney et al. ................ 427/255.7 |
| 5,427,866 | 6/1995 | Nagaraj et al. . |
| 5,500,252 | 3/1996 | Meelu . |
| 5,512,382 | 4/1996 | Strangman ................ 428/632 |
| 5,514,482 | 5/1996 | Strangman ................ 428/623 |
| 5,562,998 | 10/1996 | Strangman ................ 428/612 |

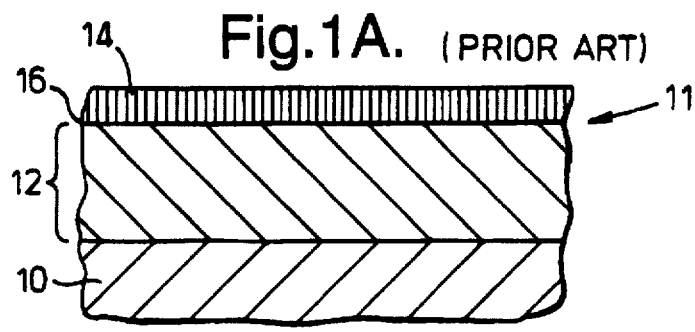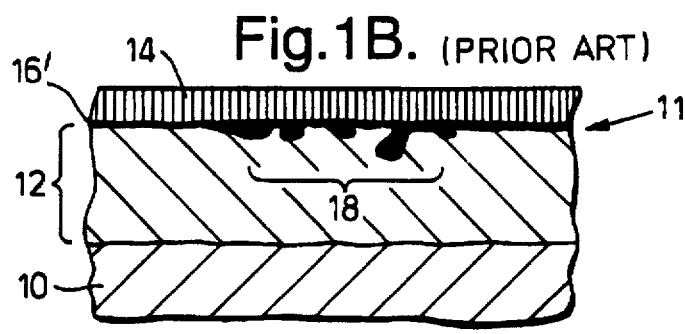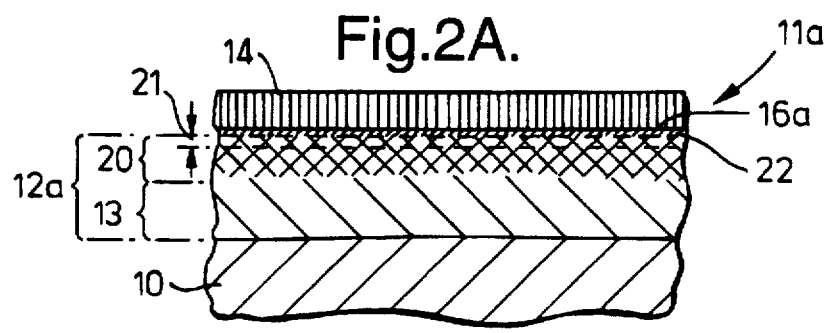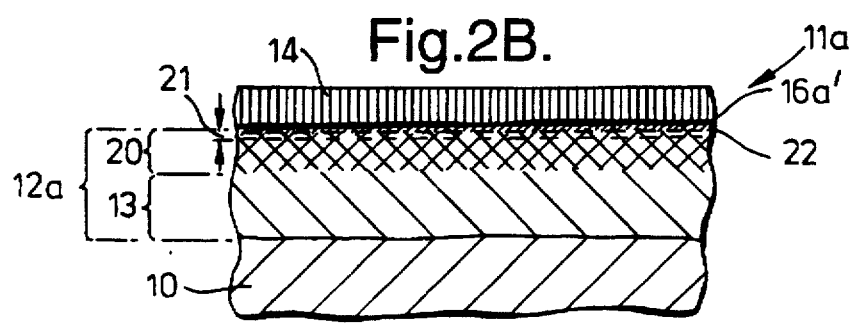

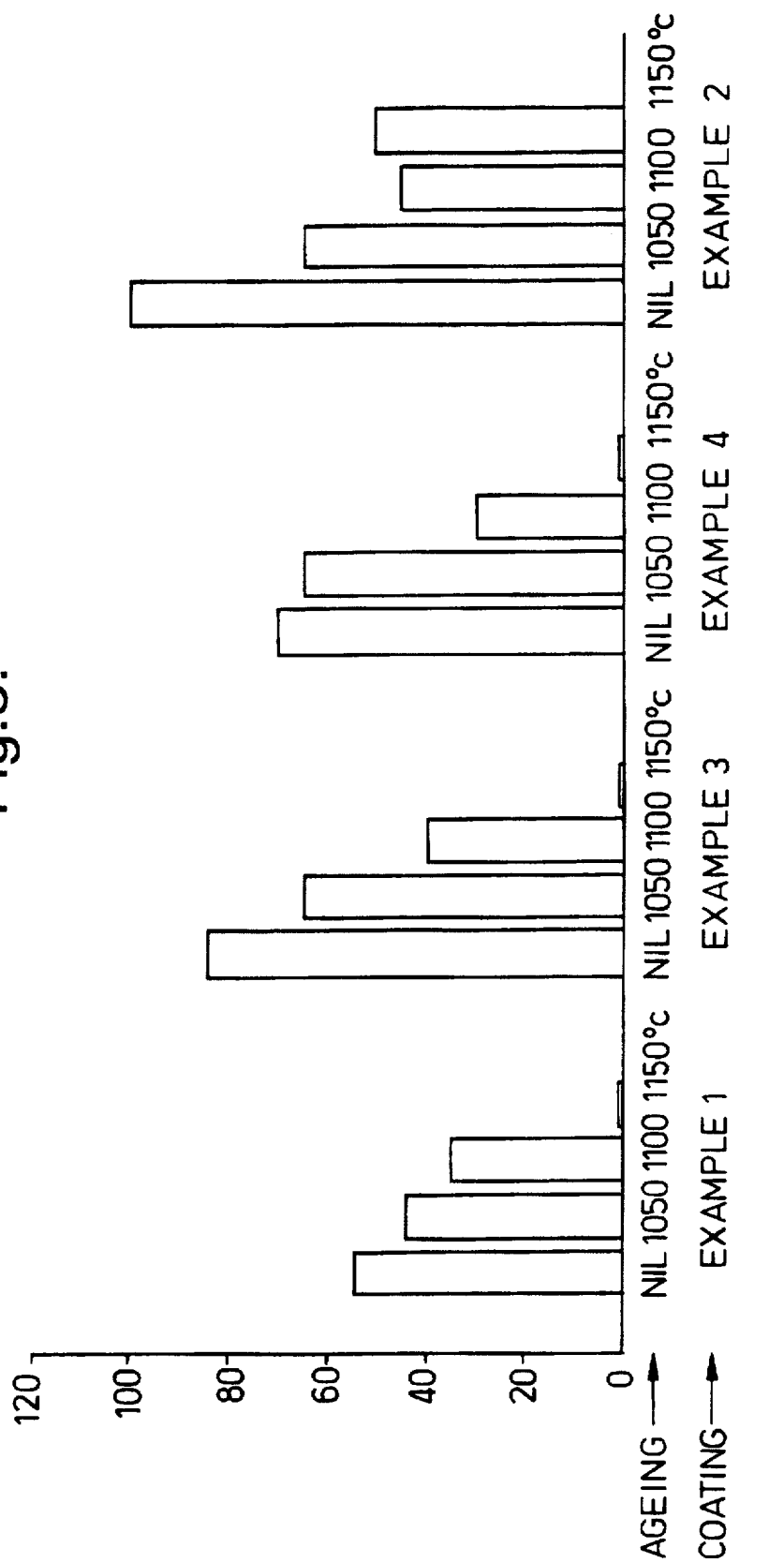

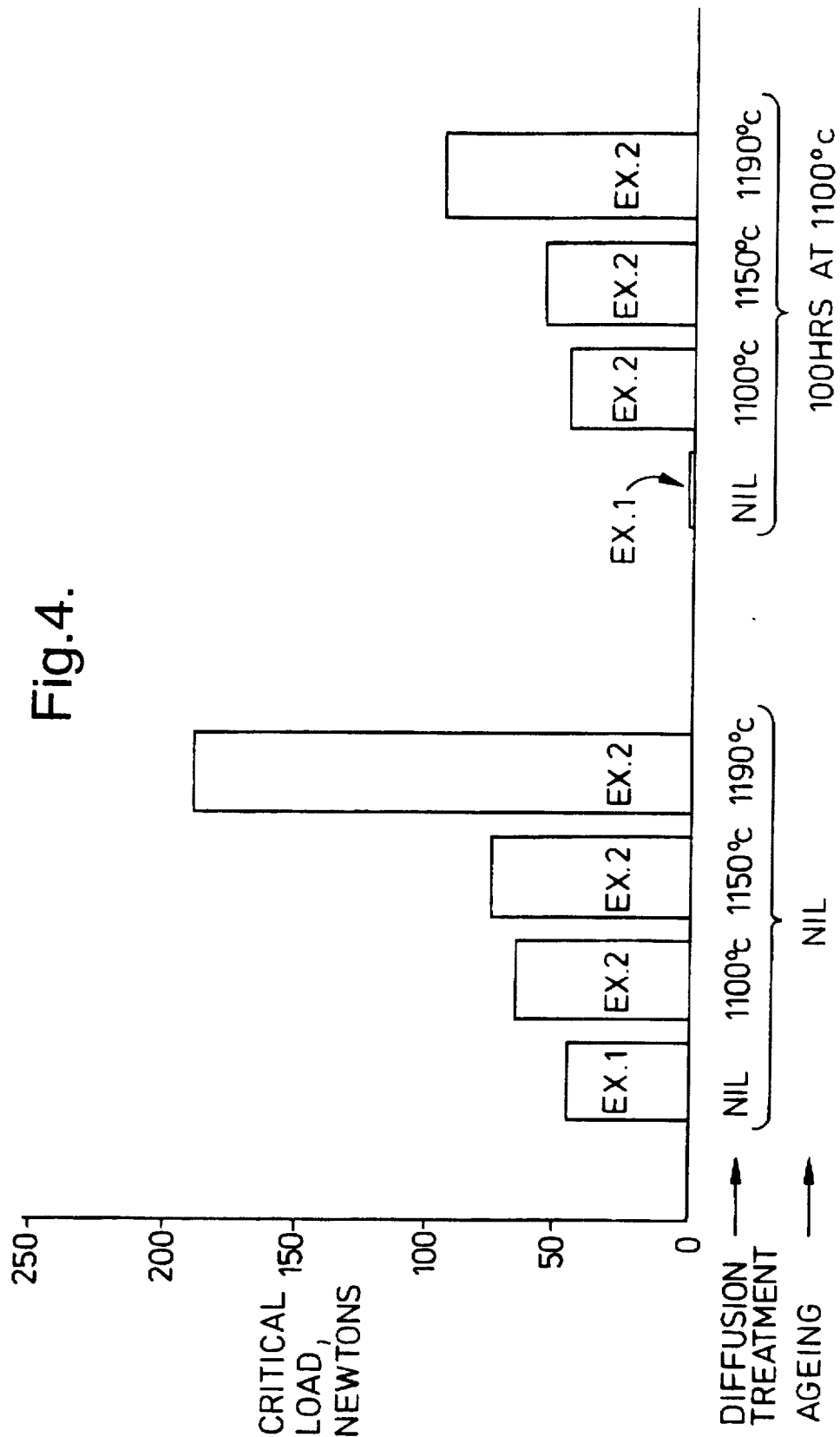

5,763,107

1

THERMAL BARRIER COATING FOR A SUPERALLOY ARTICLE

This is a Division of application Ser. No. 08/569,480 filed Dec. 8, 1995, now U.S. Pat. No. 5,645,893.

FIELD OF THE INVENTION

The present invention relates to a thermal barrier coating applied to the surface of a superalloy article, e.g. a gas turbine engine turbine blade, and to a method of applying the coating.

BACKGROUND

The constant demand for increased operating temperatures in gas turbine engines was initially met by air cooling of the turbine blades and development of superalloys from which to manufacture the blades, both of which extended their service lives. Further temperature increases necessitated the development of ceramic coating materials with which to insulate the turbine blades from the heat contained in the gases discharged from the combustion chambers; again turbine operating life was extended. However, the amount of life extension was limited because the coatings suffered from inadequate adhesion to the superalloy substrates, one reason for this being the disparity of coefficients of thermal expansion between the superalloy substrate and the ceramic coating. Coating adhesion was improved by the development of various types of aluminum-containing alloy bond coats which were thermally sprayed or otherwise applied to the superalloy substrate before the application of the ceramic coating. Such bond coats are typically of the so-called aluminide (diffusion) or "MCrAlY" types, where M signifies one or more of cobalt, nickel and iron.

Use of bond coats has been successful in preventing extensive spallation of thermal barrier coatings during service, but localized spallation of the ceramic still occurs where the adhesion fails between the bond coat and the ceramic layer. This exposes the bond coat to the full heat of the combustion gases, leading to premature failure of the turbine blade.

SUMMARY OF THE INVENTION

Thus one object of the present invention is to modify the bond coat to provide a thermal barrier coating which is less prone to localized failure and more suitable for long term adhesion to a superalloy substrate.

A further object is to provide a method of applying a thermal barrier coating to a superalloy article so as to achieve improved adhesion thereto.

According to one aspect of the present invention, a multi-layer thermal barrier coating for a superalloy substrate includes: an aluminum-containing bond coat on the substrate; a thin oxide layer on the bond coat; and an outer ceramic insulating layer on the oxide layer; the bond coat being provided with a platinum-group metal enriched outer layer having a surface layer predominantly comprising at least one aluminide of the platinum-group metals. The multi-layer thermal barrier coating on the substrate thus forms a completed multi-layer thermal barrier coated article, and the completed coated article has yet to be subjected to thermal stress.

According to one aspect of the present invention, a multi-layer thermal barrier coating for a superalloy substrate comprises a bond coating on the superalloy substrate, the bond coating comprising an aluminum containing alloy

2 coating and a coating predominantly comprising at least one aluminide of the platinum-group metals, the aluminum containing alloy coating overlying the superalloy substrate, the coating of at least one aluminide of the platinum-group metals overlying the aluminum containing alloy coating, a thin oxide layer on the bond coating, the oxide layer overlying the coating of at least one aluminide of the platinum-group metals and an insulating ceramic coating on the oxide layer, the bond coating comprises a platinum-group metal enriched aluminum containing alloy layer between the aluminum containing alloy coating and the coating of at least one aluminide of the platinum-group metals, the platinum-group metal enriched aluminum containing alloy layer and the coating of at least one aluminide of the platinum-group metals reduce migration of transition metal elements through the bond coating to the ceramic coating, the thin adherent oxide layer comprises alumina without other spinels in amounts sufficient to substantially disrupt the alumina lattice structure. By an "aluminide of the platinum-group metals" is meant any compound formed within the aluminum v. platinum-group metals phase diagrams, including alloys formed by incorporation of other metallic elements.

According to a further aspect of the present invention, a method of applying a multi-layer thermal barrier coating to a superalloy article comprises the steps of: applying an aluminum-containing alloy bond coat to the superalloy article; applying a thin layer of a platinum-group metal to the bond coat; heat treating the article to diffuse the platinum-group metal into the bond coat and thereby create a platinum-group metal enriched outer layer of the bond coat having a surface layer predominantly comprising at least one aluminide of the platinum-group metals; creating a thin adherent layer of oxide on the aluminide layer, and applying a ceramic layer to the oxide layer, preferably by a physical vapour deposition process.

According to another aspect of the present invention, a method of applying a multi-layer thermal barrier coating to a superalloy article comprises the steps of: applying an aluminum containing alloy coating to the superalloy article, forming a coating predominantly comprising at least one aluminide of the platinum-group metals on the aluminum containing alloy coating, creating a thin adherent layer of oxide on the coating of at least one aluminide of the platinum-group metals and applying an insulating ceramic coating to the oxide layer, a layer of platinum-group metal is applied to the aluminum containing alloy coating, the superalloy article is heat treated to diffuse the platinum-group metal into the aluminum containing alloy coating to thereby create the coating of at least one aluminide of the platinum-group metals and a platinum-group metal enriched aluminum containing alloy layer between the aluminum containing alloy coating and the coating of at least one aluminide of the platinum-group metals, a thin adherent layer of alumina without other spinels in amounts sufficient to substantially disrupt the alumina lattice structure is created.

DETAILED DESCRIPTION OF PREFERRED EMBODIMENTS

An advance over prior art coatings is evident in that the platinum-group metal aluminide surface coating facilitates the creation of an oxide layer comprising at least 70% by volume of alumina, preferably at least 90 vol.% alumina, most preferably at least 95 vol.% alumina. Qualitatively, utilizing appropriate material specifications and process steps as taught in this specification, it is believed that the present invention enables the creation of an oxide layer comprising alumina without other spinels in amounts sufficient to substantially disrupt the alumina lattice structure.

For the purposes of the present specification, a spinel is defined as an oxide having the general formula $M_2O_3$, where M signifies a transition metal.

Preferably, the thickness of the oxide layer as produced by the above process is less than one micron.

The aluminum-containing alloy bond coating may be a nickel or cobalt aluminide, but an MCrAlY alloy is preferred, where M is at least one of Ni, Co and Fe. The bond coat's aluminum content will depend upon the type of bond coating alloy chosen for use with the invention, being a minimum of about 5% by weight for an MCrAlY alloy bond coating and a maximum of about 40% by weight for an aluminide bond coating.

Preferably, in the finished article, the outer layer of the bond coat is enriched with platinum and in this case the aluminide surface coating predominantly comprises platinum aluminide.

We believe that such a platinum aluminide surface coating will contain at least 25 wt.% platinum, preferably at least 40 wt.% and optimally at least 50 wt.% platinum, with aluminum levels of at least 8 wt.%, preferably at least 10 wt.%.

To produce a platinum enriched aluminum containing alloy layer with an aluminide surface coating predominantly comprising platinum aluminide, the thickness of the layer of platinum as applied before diffusion is preferably greater than 3 µm, more preferably at least 5 µm.

The diffusion heat treatment is preferably carried out for about one hour at a temperature in the range 1000–1200° C., preferably 1100–1200° C., depending upon the composition of the superalloy substrate. After cleaning off any diffusion residues from the surface of the platinized bond coating, the article receives its thin adherent layer of oxide and its ceramic top coating.

The thin adherent layer of oxide is preferably created by heating the platinum-group metal aluminide coating in an oxygen-containing atmosphere.

Conveniently for the creation of the thin adherent oxide layer, we prefer to use electron beam physical vapour deposition (EBPVD) to apply the ceramic layer. In the preferred EBPVD process, the article is preheated to a temperature in the range 900–1150° C. in a vacuum, say at a pressure of about $10^{-5}$ Torr. A preferred preheat temperature is about 1000° C.

The EBPVD ceramic coating process, using yttria stabilized zirconia or other oxide ceramic, involves evaporation of the ceramic by the electron beam and consequent liberation of oxygen by dissociation of the ceramic. We also prefer to add oxygen to the coating chamber deliberately at this stage to encourage stoichiometric re-formation of the ceramic on the article being coated, though this is not always considered essential by some sectors of the industry. Hence, in our preferred process, oxygen is inevitably present in the atmosphere of the coating chamber during coating by EBPVD and reacts with the preferred platinum aluminide surface coating of the bond coating, forming the thin adherent oxide layer mentioned above, a typical thickness of the oxide layer being less than 1 µm. The ceramic coating adheres well to the oxide layer, the latter effectively becoming a bonding layer. It is due to the presence of the preferred platinum enriched aluminum containing alloy layer and platinum aluminide coating of the bond coating that the oxide layer formed during the preheating step can comprise greater than 95 vol.% alumina ($Al_2O_3$).

During subsequent aging of the coating in service, the oxide layer grows gradually in thickness due to diffusion of oxygen through the coating from the environment. However, it is found that the preferred platinum enriched aluminum containing alloy layer of the bond coating, and particularly the preferred platinum aluminide surface coating, restricts the rate of growth of the oxide layer and promotes the evenly spread production of alumina therein, rather than the production of other spinels having different crystal lattice structures which are known to have higher growth rates and therefore reduce adhesion of the ceramic coating thereto.

Use of EBPVD in application of the ceramic coating can be with or without plasma assistance. However, as disclosed in copending published International patent application No. WO93/18199, both EBPVD techniques can be used alternately, which enables control of the columnar coating structure so as to ensure high strength with decreased thermal conductivity. For further detail concerning such coatings and the processes of applying them, reference should be made to the above patent publication, which is hereby incorporated by reference.

Further aspects of the invention will be apparent from a perusal of the following description and claims.

BRIEF DESCRIPTION OF THE DRAWINGS

The invention will now be described by way of example and with reference to the accompanying drawings, in which:

FIGS. 1A and 1B are cross-sectional diagrammatic views through a metallic article having a prior art thermal barrier coating applied thereto;

FIGS. 2A and 2B are cross-sectional diagrammatic views through a metallic article having a thermal barrier coating in accordance with the present invention;

FIG. 3 is a bar chart showing the results of tests of relative performance of four different coating types;

FIG. 4 is a bar chart showing the influence of diffusion heat treatment temperatures on performance of coatings in accordance with the invention;

Figure 5:
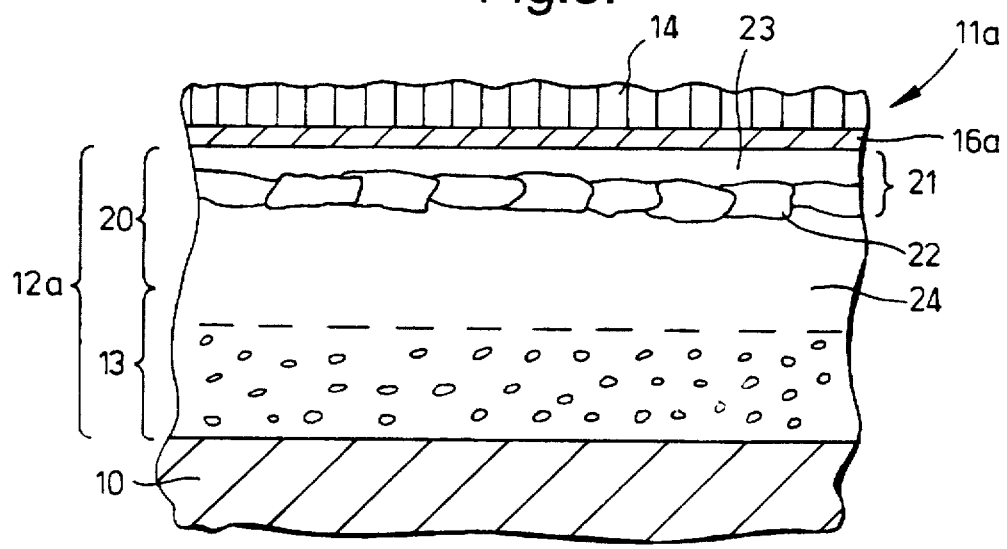
FIG. 5 is a cross-sectional diagrammatic view through a metallic article showing the thermal barrier coating in more detail.

Referring first to FIG. 1A, illustrating the state of the art, there is shown part of a superalloy article 10 provided with a multi-layer thermal barrier coating indicated generally by numeral 11. It is shown in the "as manufactured" condition.

Coating 11 is constituted generally as follows. It comprises a plasma-sprayed and diffusion heat treated MCrAlY alloy bond coat layer 12 and a columnar layer of yttria-stabilized zirconia ceramic 14 applied thereover by a known EBPVD process.

The microstructure of the MCrAlY bond coat 12 broadly comprises three phases, these being an alpha phase, a beta phase, and a small amount of an yttrium-rich phase. The alpha phase comprises a solid solution of nickel, cobalt, chromium, yttrium and aluminum, with minor amounts of other elements which have migrated from the substrate. The beta phase comprises an aluminide of cobalt, nickel and aluminum, with chromium and other metallic elements dissolved in the aluminide up to certain solubility limits.

Importantly, at the interface between the layers 12 and 14 there is a thin oxide layer 16, produced as a consequence of the EBPVD coating process. As in the other Figures, the thickness of the oxide layer 16 in FIG. 1A is exaggerated relative to the other layers of the coating 11.

EXAMPLE 1

A batch of specimens as illustrated in FIG. 1A were produced. In this example, as in the further Examples 2 to 6 described below, the article 10, which forms the substrate for the coating 11, was made of a nickel-based superalloy called MAR-M 002, a trade name of the Martin Marietta Corporation, of Bethesda, Md., U.S.A. Its nominal composition is given in Table 1 below.

TABLE 1

| ELEMENT | WEIGHT % |
| --- | --- |
| Tungsten | 10 |
| Cobalt | 10 |
| Chromium | 9 |
| Aluminum | 5.5 |
| Tantalum | 2.5 |
| Titanium | 1.5 |
| Hafnium | 1.5 |
| Carbon | 0.15 |
| Nickel | Balance |

In this example, as in the further Examples 2 to 6 described below, the aluminum-containing bond coat alloy 12 was of the MCrAlY type. Its composition is given in Table 2 below.

TABLE 2

| ELEMENT | WEIGHT % MINIMUM | WEIGHT % MAXIMUM |
| --- | --- | --- |
| Nickel | 31.0 | 33.000 |
| Chromium | 20.0 | 22.000 |
| Aluminum | 7.0 | 9.000 |
| Yttrium | 0.35 | 0.650 |
| Carbon | 0.00 | 0.025 |
| Oxygen | 0.00 | 0.050 |
| Nitrogen | 0.00 | 0.010 |
| Hydrogen | 0.00 | 0.010 |
| Other Elements in total | 0.00 | 0.500 |
| Cobalt | Balance | |

The alloy specified in Table 2 is available from Praxair Surface Technologies, Inc., (formerly Union Carbide Coating Service Corporation), of Indianapolis, U.S.A., under the trade name LCO22.

The bond coat alloy of Table 2 is initially in powder form, its mesh size range being:

<270 mesh up to 100% by weight
>325 mesh maximum 1% by weight

The powder size range in µm is:

<5 µm maximum 5% by weight
<10 µm 10–15% by weight
<20 µm 35–55% by weight

To produce the prior art coating 11, the following procedure was followed.

After thorough preparation and cleaning of the surface of the article 10 by grit blasting with fine alumina grit and degreasing, the bond coat alloy powder mix was thermally sprayed in known manner onto the surface by use of a plasma gun in an evacuated chamber.

To ensure bonding of the MCrAlY coating to the substrate, the sprayed article was diffusion heat treated at 1100° C. for one hour. This produced the three-phase alloy microstructure noted above.

After removal of diffusion residues by grit blasting and degreasing, a layer of a ceramic 14 consisting of partially stabilized zirconia (in this case, zirconia containing 8% by weight of yttria) was applied by electron beam physical vapour deposition (EBPVD). This coating is available from Chromalloy Gas Turbine Corporation of Delaware, U.S.A.

For the EBPVD process, the article was first held in a preheating chamber and preheated to a temperature of about 1000° C. at a pressure of $10^{-5}$ Torr. It was then immediately transferred to an electron beam coating chamber, where it continued to be held for coating at 1000° C., at a pressure of $10^{-2}$ to $10^{-3}$ Torr, in an atmosphere consisting of argon and oxygen.

It should be noted that in the present and following Examples 1 to 4, some of the free oxygen in the coating chamber's atmosphere results from the dissociation of $ZrO_2$ as it is evaporated by the electron beam in the coating chamber. The dissociated constituents of the ceramic recombine with each other as the vapour is deposited on the article. However, unless assisted, this recombination tends to be incomplete, i.e., the oxygen binds to the zirconium in sub-stoichiometric proportions, resulting in a deficiency of oxygen in the ceramic and free oxygen in the atmosphere of the coating chamber. Recombination of the ceramic in stoichiometric proportions is assisted by providing an excess of oxygen, thereby further adding to the amount of oxygen in the coating chamber.

The presence of oxygen at an elevated temperature during the EBPVD coating process made it inevitable that a thin oxide layer formed on the surface of the bond coat. The oxide layer was covered by the ceramic layer and became the interface oxide layer 16 mentioned above. As shown in Example 5, the oxide layer so produced was a mixture of alumina, chromia and other spinels.

Some specimens were subjected to a standardized adhesion test in which the strength of the bond between the ceramic layer and the bond coat was determined. On average, it was found that the critical load, beyond which the ceramic would break away from the bond coat, was about 55 Newtons.

The remaining specimens were then subjected to an ageing process to simulate a period of service in the turbine of a gas turbine engine. FIG. 1B illustrates one of the specimens after it had been subjected to ageing by heating in air to a temperature of 1150° C. for 100 hours.

The oxide layer 16', initially produced during the coating process as layer 16 in FIG. 1A, had thickened and changed in character during the ageing process, as will be explained below.

Several specimens aged like that in FIG. 1B were assessed as before to determine the strength of the bond between the ceramic layer and the bond coat. On average, it was found that the critical load was now less than 5 Newtons.

The following explanation for this large decrease in coating adhesive strength is tentatively advanced.

Firstly, alumina, chromia and other spinels have differing crystal lattice structures. The oxide layer apparently becomes more incoherent with ageing, and therefore weaker and less adherent to the adjacent layers. It is believed that this is due to migration of transition metals other than aluminum from the superalloy substrate 10 and the bond coat 12 into the base of the ceramic top coat 14, thereby promoting growth of several spinels with incompatible lattice structures as oxygen from the environment diffuses through the ceramic top coat 14.

Secondly, the general thickening of the oxide layer 16' produces increased inherent stress at the interface between the bond coat and the ceramic layer, weakening overall adhesion.

Thirdly, alumina has a lower growth rate than the other spinels. The effect of the higher growth rate of these other spinels is particularly evident in the region 18, where localized portions of the developed oxide layer 16' have grown to greatly exceed the thickness of the layer elsewhere. It has been found that during service of coatings of the above type, spalling of the coating tends to occur wherever the thickness of the oxide layer 16 exceeds about 5 μm.

EXAMPLE 2

Referring now to FIG. 2A, a batch of specimens prepared in accordance with the present invention comprised a superalloy article 10 provided with a multi-layer thermal barrier coating 11a. Coating 11a comprised a bond coat 12a, which was initially the same as the bond coat 12 of Example 1, and a columnar ceramic top coat 14, as in Example 1. A thin oxide layer 16a was also present at the interface between the bond coat and the ceramic coat, again produced during the EBPVD ceramic coating process.

However, the finished structure of coating 11a differed from Example 1, inter alia, in that the bond coat 12a was provided with a platinum-enriched outer layer 20 underneath the oxide layer 16a. Furthermore, when a specimen was subjected to electron probe microanalysis, the platinum enriched layer 20, particularly an outer zone 21 of layer 20 (say the top 15–20 μm) was notable for containing an enhanced proportion of aluminum. Both zone 21 and, to a lesser degree, the rest of the platinum enriched layer 20, contained depressed proportions of nickel, cobalt and chromium relative to an underlying layer 13 of the bond coat 12a. Layer 13, particularly its outer part, also exhibited lower aluminum content than was present in the initial MCrAlY alloy, due to some of the aluminum having migrated towards the outer parts of the bond coat 12a.

In a traverse of the bond coat 12a in the outward direction, the microstructure of the layer 13 appeared similar to the MCrAlY alloy bond coat 12 in Example 1, exhibiting alpha, beta and yttrium-rich phases. However, the microstructure of platinum enriched layer 20 exhibited a rapid change away from the MCrAlY alloy phases, due to the above-noted changes in elemental proportions compared with layer 13, while in an outermost surface layer 22 of the bond coat, the microstructure was characteristic of platinum aluminide, layer 22 being several microns thick. Also notable in the outermost several microns of the bond coat was the presence of yttrium which had migrated from the underlying layer. Yttrium is known to promote adherence of the oxide layer 16a.

Furthermore, as separately shown in Example 6, the oxide layer 16a consisted wholly or almost wholly of alumina, with much smaller or negligible amounts of the other spinels which had been produced in Example 1. Thickness of the alumina layer 16a after application of the ceramic coating was found to be less than 1 μm.

Production of such a specimen followed the same process steps as for Example 1, except in the following particulars.

After application, diffusion and cleaning of the bond coat 12a, a layer of platinum of substantially constant thickness was applied, the thickness being about 8 μm. However, in performing the invention the thickness could vary upwards of about 3 μm, depending on a number of factors, such as substrate and bond coat materials used, diffusion temperatures and service conditions. The importance of these factors in relation to platinum coating thickness can be determined by experiment. The platinum layer was applied by electroplating, but any other means could be used which will achieve a sufficient substantially uniform thickness without detriment to the material's properties.

A further diffusion heat treatment step was then effected so as to cause the platinum layer to diffuse into the bond coat. This provided the platinum-enriched layer 20, with the outer layers 21 and 22 having the particular characteristics mentioned above.

Diffusion was achieved by heating the article to a temperature of 1190° C. In a vacuum chamber and holding that temperature for one hour. In performing the invention a range of heat treatment temperatures could be used from 1000° C. to 1200° C. inclusive, according to the solution treatment temperature normally used for the superalloy substrate 10. In the present example, 1190° C. is higher than the accepted solution treatment temperature for MAR-M 002, but was utilized as one of a range of diffusion treatments as explained later. Although different diffusion times could be used, it was judged that one hour was sufficient at this range of temperatures for the platinum to be properly combined with the bond coat without prematurely ageing the bond coat and the underlying substrate.

After heat treatment the surface was grit blasted with dry $Al_2O_3$ powder of a 120–220 μm particle size to remove any diffusion residues. The ceramic top coat 14 was then applied as in Example 1.

Several specimens like that in FIG. 2A were tested in the same way as in Example 1 to determine the strength of the bond between the ceramic coat and the bond coat. On average, it was found that the critical load, beyond which the ceramic would break away from the bond coat, was about 100 Newtons, nearly a two-fold improvement over Example 1. This is believed to result from the better coherence of the oxide layer 16a as initially produced during the ceramic coating process. Evidently, the presence of the platinum enriched layer in the outer part of the bond coat prevented migration of transition elements through the bond coat into the base of the ceramic layer during the coating process. Furthermore, it is believed that the presence of platinum, particularly the platinum aluminide surface layer 22, promoted the inward growth of the alumina during the ceramic coating process, instead of a more rapid outward oxide growth into the base of the ceramic layer.

FIG. 2B illustrates the same coating as FIG. 2A, but after the article 10 had been subjected to the same ageing process as was mentioned for Example 1, i.e., heating in air to a temperature of 1100° C. for 100 hours. The oxide layer 16a', initially produced during the coating process as oxide layer 16a, has thickened somewhat, but not as much as in Example 1.

Several specimens like that in FIG. 2B were assessed as before to determine the strength of the bond between he ceramic layer and the bond coat after ageing. On average, it was found that the critical load was still nearly 50 Newtons, on the order of a twenty-fold increase compared with the coating of Example 1 after ageing.

The following explanation for this large increase in coating adhesive strength is tentatively advanced.

Firstly, the oxide layer had apparently retained much of its initial coherence despite ageing, and had therefore retained more strength and adherence to the adjacent layers. As mentioned above in respect of the ceramic coating step, this is believed due to the platinum-enriched layer 20 acting as a barrier to migration of transition metals from the superalloy substrate 10 and the bond coat 12a into the base of the ceramic top coat 14, thereby preventing growth of spinels with lattice structures incompatible with alumina.

Secondly, the thickening of the oxide layer during ageing was both less in magnitude and more even in distribution than in Example 1. This produced less inherent stress at the interface between the bond coat and the ceramic layer. This is believed due to the coherent alumina layer acting as a more uniform barrier to diffusion of oxygen through the ceramic top coat into the bond coat.

Formation of the platinum-enriched layer 20 is believed to proceed as follows.

The MCrAlY alloy bond coat contains nickel-cobalt aluminide (NiCoAl). During the platinizing diffusion heat treatment, this aluminide is broken down due to aluminum's greater chemical affinity for platinum. The freed aluminum therefore rapidly migrates towards the platinum and creates the platinum aluminide surface layer 22 and the notably depressed nickel, cobalt and chromium content in zone 21 relative to the rest of the platinum enriched layer 20 and the MCrAlY alloy layer 13. Although the platinum aluminide is concentrated near the surface of the bond coat in layer 22, it is also present to a decreasing extent throughout the depth of layer 20. All or most of the platinum is combined with aluminum in this way.

During ageing, the alumina layer is believed to grow as follows.

During ageing, oxygen diffusing through the ceramic layer 14 and the existing alumina layer 16a, strips the aluminum from the platinum at the surface of the platinum aluminide layer 22 and preferentially combines with it, so maintaining gradual inward growth of the substantially pure alumina layer. The freed platinum then attracts further aluminum, which migrates from deeper in the platinum enriched layer 20 and the MCrAlY alloy layer 13, so maintaining a supply of aluminum at the surface of the layer 22 for combination with further oxygen. This maintains the coherence of the oxide layer during the ageing process.

EXAMPLE 3

A further batch of specimens (not illustrated) was prepared with a multi-layer thermal barrier coating again comprising an MCrAlY bond coat and a columnar ceramic top coat. As before, a thin oxide layer was also present at the interface between the bond coat and the ceramic coat, again produced during the EBPVD ceramic coating process.

The coating differed from Examples 1 and 2 in that the superalloy substrate was provided with a platinum-enriched surface layer directly underneath the bond coat.

Production of such a specimen followed the same process steps as for Example 1, except that before application of the bond coat, a layer of platinum having a substantially constant thickness of about 8 μm was applied to the superalloy substrate by electroplating and was then diffused into the substrate to provide the platinum enriched layer mentioned above.

As for Example 2, platinizing diffusion was achieved by heating the article to a temperature of 1190° C. In a vacuum chamber and holding that temperature for one hour. After heat treatment the surface was grit blasted to remove diffusion residues. The bond coat and ceramic top coat were then applied as in Example 1.

Several such specimens were tested in the same way as in Example 1 to determine the strength of the bond between the ceramic coat and the bond coat. On average, it was found that the critical load, beyond which the ceramic would break away from the bond coat, was about 85 Newtons, an improvement over Example 1, but less than achieved for Example 2. This intermediate result is believed to reflect a coherence of the oxide layer intermediate to that evidenced in Examples 1 and 2. Evidently, the platinum enriched layer in the outer part of the superalloy substrate prevented migration of substrate transition elements through the bond coat into the base of the ceramic layer during the ceramic coating process, but could not of course prevent migration of cobalt, nickel and chromium from the bond coat towards the ceramic layer.

After several specimens had been subjected to the same ageing process as was mentioned for Examples 1 and 2, they were assessed as before to determine the strength of the bond between the ceramic layer and the bond coat after ageing. On average, it was found that the critical load showed no improvement over Example 1. This result implies that similar deterioration of the oxide layer occurred, allowing increasing amounts of oxygen across the oxide layer to combine with migrating elements from the bond coat.

EXAMPLE 4

Another batch of specimens (not illustrated) was prepared using a process which differed from Example 2 only in that the layer of platinum electroplated onto the 5 bond coat was about 3 μm thick instead of 8 μm thick. Diffusion heat treatment was the same as for Example 2 to provide a platinum-enriched outer layer for the bond coat.

Specimens were tested before and after ageing in the same way as in Examples 1 to 3.

Before ageing, the average critical load was about 70 Newtons, an improvement over Example 1, but less than achieved for Example 3. This result is believed to reflect inadequate thickness of the deposited platinum layer and consequent inadequate platinum enrichment of the outermost layer of the bond coat. Evidently, the platinum enrichment was insufficient to prevent migration of transition elements through the bond coat into the base of the ceramic layer during the coating process. After ageing, the average critical load showed no significant improvement over Example 1. This result again implies that insufficient platinum enrichment had occurred.

To achieve the full benefits of the invention using platinized MCrAlY bond coats, we prefer that the thickness of the electroplated platinum layer be significantly in excess of 3 μm, more preferably at least 5 μm, most preferably 8 μm, as in Example 2. 8 μm is not an upper limit, but we prefer not to apply platinum to a much greater thickness than this due to the expense of platinum as a raw material and the probability that longer diffusion heat treatment times would be needed to obtain relatively small increases in coating adhesion.

Referring now to FIG. 3, there are shown comparative adhesion strengths for coatings according to Examples 1 to 4 when subjected to a range of ageing treatments. The results for no ageing and for ageing at 1150° C. for 100 hours have already been quoted above in respect of each Example. Also shown in FIG. 3 are the results for ageing some specimens for the same period but at the lower temperatures of 1050° C. and 1100° C.

The chart shows that increased severity of ageing up to a temperature of 1100° C. reduces coating adhesive strength by up to about half of its original value, this weakening being least pronounced for Example 1, though this example's adhesive strength was lowest to begin with. However, for Examples 1, 3 and 4, further increasing the severity of ageing up to a temperature of 1150° C. reduces coating adhesive strength to almost zero, whereas for Example 2, the same increase in ageing temperature produces no further substantial decline in adhesive strength, within the limits of experimental error, thereby illustrating the utility of the present invention.

Referring now to FIG. 4, there are shown comparative adhesion strengths for coating specimens according to Examples 1 and 2 when subjected to a range of platinizing diffusion heat treatments with and without subsequent ageing. The platinizing diffusion heat treatments range from none for Example 1 (since it has no platinum enriched layer) through treatments at 1100° C., 1150° C. and 1190° C. for Example 2, the periods of heat treatment all being one hour. The results for these specimens without ageing and for ageing at 1100° C. for 100 hours are shown side-by-side.

The chart shows that increased platinizing diffusion temperature for coatings in accordance with the invention leads to increased coating adhesive strength both before and after ageing. Although the highest diffusion temperature of 1190° C. produced the most pronounced strengthening effect in specimens according to Example 2, even after ageing, this diffusion treatment would not in practice be preferred because it exceeds the normal solution treatment for MAR-M 002 alloy, which is 1150° C. for one hour. The normal solution heat treatment coincides with the next most severe platinizing diffusion heat treatment shown in FIG. 4, which is therefore preferred for this particular superalloy. Diffusion at 1150° C. still yields a large increase in coating bond strength after ageing compared with the prior art. As before, the prior art Example 1 was initially the weakest coating and ageing reduced its strength to almost zero.

To enable a comparison to be made between the composition of an oxide layer as produced by a prior art process, and the composition of an oxide layer as produced by a process according to the invention, further analysis was conducted as described below in Examples 5 and 6.

EXAMPLE 5

Production of a specimen for analysis followed the same process steps as for Example 1, except that the final columnar ceramic top coat was not applied. Instead, the oxide layer on the MCrAlY alloy coating was developed using a simulation of the ceramic coating process conditions explained in Example 1, but without EBPVD deposition of the yttria stabilized zirconia being initiated. Consequently, after production of the oxide layer, it could be analyzed using an X-ray diffraction technique. This showed that the oxide layer which had been developed on the MCrAlY bond coat comprised a mixture of approximately 65% by volume of alumina, with 35 vol.% nickel and chromium oxides having the general formula $M_2O_3$.

EXAMPLE 6

Production of a specimen followed the same process steps as for Example 2, except that the final columnar ceramic top coat was not applied. As in Example 5, the ceramic coating process conditions were simulated so as to develop the oxide layer without covering it with the ceramic coating. When an X-ray diffraction analysis was performed on the oxide layer, it was found to comprise 100 vol.% alumina, with an experimental error of about −5 vol.%. Evidently, the process steps of Example 2 had enabled the creation of an oxide layer comprising alumina without other spinels in amounts sufficient to substantially disrupt the alumina lattice structure.

As already mentioned, the notable increase in adhesion which is provided by thermal barrier coatings in accordance with the invention, such as that described herein with reference to FIG. 2 and Example 2, is believed due to the oxide layer 16a being composed of alumina without large amounts of other spinels, even after ageing has occurred. Whilst growth of the oxide layer 16a during service is still inevitable, as it was between the ceramic coat and bond coat of the prior art, the added oxide is now substantially all $Al_2O_3$ rather than the mixed spinels of the prior art.

The attributes of a good bond coating for good adhesion of a thermal barrier coating are that the bond coating has the ability to prevent, or reduce, the migration of transition metal elements to the ceramic thermal barrier coating. The migration of transition metal elements is preferably blocked by a continuous layer in the bond coating, or slowed by formation of stable compounds by a layer in the bond coating. This attribute enables the resulting thermally grown oxide formed on the bond coating to be very pure alumina. The bond coating is preferably stable to ageing at high temperatures so that it still prevents, or reduces, the migration of transition metal elements to ensure that any further growth of the oxide on the bond coating is by formation of alumina. These attributes are facilitated by the formation of a stable layer close to the thermally grown oxide interface between the bond coating and the ceramic thermal barrier coating.

The following advantages accrue from practice of the invention:

A. The growth of the oxide layer is slowed, resulting in the formation of a thinner layer over longer periods of time.

B. The oxide layer remains a substantially even thickness during ageing, thus providing more constant adhesive quality over the whole interface of the ceramic with the oxide.

C. At least in the case of vacuum plasma sprayed MCrAlY coatings which have been platinized, adhesion of the oxide layer seems to be enhanced by the presence of yttrium in the platinum aluminide layer.

D. The platinum enriched layer of the bond coat restricts the migration of transition metals through the bond coat into the ceramic.

E. The true capability of the thermal barrier coating to act as a thermal barrier is enabled for longer periods of time than heretofore, through the achievement of considerable delay of the onset of spalling. It follows that where the article is a superalloy turbine blade, its operating life is enhanced.

The additional FIG. 5 shows the multi-layer thermal barrier coating 11a shown in FIGS. 2A and 2B in more detail. The thermal barrier coating 11a comprises a bond coat 12a, and oxide layer 16a and a columnar ceramic top coat 14. The bond coat 12a comprises a MCrAlY alloy layer 13 overlying the superalloy article 10, and a platinum enriched alloy layer 20 overlying the MCrAlY alloy layer 13. The oxide layer 16a overlies the platinum enriched alloy layer 20 and the columnar ceramic top coat 14 overlies the oxide layer 16a.

As mentioned previously the platinum enriched alloy layer 20 contains an enhanced proportion of aluminum and depressed proportions of nickel, cobalt and chromium relative to the MCrAlY alloy layer 13. The platinum enriched alloy layer 20 has an outer zone 21 which is particularly rich in aluminum. The outer zone 21 comprises an outermost surface layer 22 which is characteristic of platinum aluminide, we have found that this platinum aluminide is a previously unknown form of platinum aluminide which we have termed the "P" phase. The "P" phase for example has a composition of 53 wt% Pt, 19.5 wt% Ni, 12 wt% Al, 8.7 wt% Co, 4.9 wt% Cr, 0.9 wt% Zr, 0.6 wt% Ta, 0.1 wt% O and 0.04 wt% Ti as processed.

At the outermost several microns of the bond coat 12a overlying the layer 22 of "P" phase platinum aluminide is 35 a layer 23 of platinum enriched face center cubic gamma phase. The platinum enriched gamma phase for example has a composition of 33.4 wt% Co, 23 wt% Ni, 19.5 wt% Pt, 19.7 wt% Cr, 3.7 wt% Al, 0.3 wt% Zr and 0.2 wt% O as processed. The platinum enriched gamma phase may also contain platinum enriched gamma prime phase.

The yttrium is to be found in this platinum enriched gamma phase and also to some extent in the "P" phase platinum aluminide. As discussed earlier during ageing oxygen diffusing through the ceramic coating 14 and existing alumina layer 16a strips the aluminum from the surface of the platinum aluminide layer 22. This stripping of aluminum from the platinum aluminide layer 22 causes the "P" phase platinum aluminide at the surface of the platinum aluminide layer 22 to change to the platinum enriched gamma phase. Thus the alumina layer 16a is bonded to the "P" phase platinum aluminide layer 22 by a layer of platinum enriched gamma phase 23.

The "P" phase platinum aluminide layer 22 forms a continuous layer which exhibits good stability together with the ability to reduce, or prevent, the migration of transition metal elements from the superalloy substrate 10 and the bond coat 12a into the base of the ceramic top coat 14 by forming a continuous layer which blocks the migration of the transition metal elements. In particular the "P" phase platinum aluminide 22 reduces the migration of titanium, hafnium and tantalum which are known to decrease the adherence of the ceramic top coat 14 by promoting the formation of lesser protective oxides which grow at a faster rate than pure alumina.

The platinum enriched alloy layer 20 comprises a platinum modified MCrAlY alloy layer 24 between the MCrAlY alloy layer 13 and the platinum aluminide layer 22. The platinum modified MCrAlY alloy layer 24 comprises a platinum enriched gamma phase which slows down the migration of the transition metal elements from the superalloy substrate 10 and the bond coat 12a to the base of the ceramic top coat 14. Furthermore the platinum forms strong complex molecules with free titanium and prevents the titanium migrating to the base of the ceramic top coat 14. The platinum modified MCrAlY layer 24 comprises a platinum enriched gamma phase matrix with some "P" phase in the platinum enriched gamma phase matrix. The platinum enriched gamma phase for example comprises 33.4 wt% Pt, 26.5 wt% Co, 17.7 wt% Ni, 16.5 wt Cr, 3.7 wt% Al, 0.9 wt% Zr, 0.8 wt% O, 0.4 wt% Y, 0.06 wt% Ta and 0.03 wt% W as processed. The "P" phase in this region for example comprises 59.7 wt% Pt, 15 wt% Ni, 9.8 wt% Al, 8.5 wt% Co, 5.2 wt% Cr, 1.3 wt% Zr, 0.5 wt% O, 0.01 wt% Ta and 0.01 wt% W as processed.

The layers 24 and 22 act to reduce, or prevent, the migration of harmful transition metal elements to the platinum enriched gamma phase layer 23 and the alumina layer 16a. The result is that the alumina is very pure and there is a very low growth rate of the alumina layer because there is very little, or no, influence from metals which form oxides with higher growth rates. Also the presence of yttrium in the platinum enriched gamma phase layer 23 is thought to influence oxide scale adhesion by pegging of the alumina, eliminating voids at the alumina/bond coat interface and altering the alumina scale plasticity to lower the residual stress levels.

Our tests have shown that the "P" phase platinum aluminide layer 22 is very stable to ageing at high temperatures, for example at temperatures between 1100° C. and 1210° C. for 25 hours and still acts as a barrier to the movement of transition metal elements, titanium etc, towards the platinum enriched gamma phase layer 23 and the alumina layer 16a because very low concentrations of the damaging transition metal elements are maintained.

The ageing of the coating at temperatures between 1100° C. and 1210° C. causes the "P" phase composition in layer 22 to change between 36 wt% Pt, 27 wt% Ni, 14.8 wt% Co, 13.9 wt% Al, 6.3 wt% Cr, 0.6 wt% Ta, 0.4 wt% Zr, 0.07 wt% O, 0.03 wt% W and 0.02 wt% Ti at 1100° C. and 35 wt% Ni, 29 wt% Pt, 14 wt% Co, 13 wt% Al, 6 wt% Cr, 0.9 wt% Ta, 0.5 wt% Zr, 0.4 wt% Ti, 0.3 wt% Y and 0.2 wt% O at 1210° C.

The "P" phase composition is broadly speaking 29–60 wt% Pt, 15–35 wt% Ni, 8–17 wt% Co, 9–15 wt% Al, 4.5–7 wt% Cr, 0–1 wt% Y and 0–2 wt% Ti, Ta, Zr, O and other elements.

The "P" phase is preferably formed in the temperature range of 1100° C. to 1200° C. As indicated in FIG. 4, the higher the tempera-cure of heat treatment the greater is the stability of the thermal barrier coating. At lower temperatures some "P" phase forms but it does not form a continuous layer to block the migration of transition metal elements to the alumina and platinum enriched gamma phase, particularly with the thinner thicknesses of platinum deposited.

Whilst the MCrAlY alloy of the bond coat has been disclosed herein in detail, it is only by way of example and may be substituted by other known aluminum-containing alloy bond coats, for instance, a nickel aluminide alloy composed of nickel and aluminum in stoichiometric proportions, such as that sold by the Chromalloy Corporation under the trade name RT 69.

Application of the bond coat has been described as being by the vacuum plasma spray process in the Examples. However, other modes of application could be used, e.g. argon-shrouded plasma spray or an EBPVD process of the type used for the ceramic top coat.

However, to obtain the best performance for a bond coat, if a MCrAlY alloy is used for the bond coat, it is preferred to use the vacuum plasma spray process to deposit the MCrAlY alloy onto the superalloy substrate. The MCrAlY is preferably vacuum plasma sprayed, polished and peened before the platinum-group metal is deposited onto the MCrAlY and heat treated. Our tests have shown improved adhesion of the ceramic top coat when the bond coat is produced in this manner. It is theorized this is because there is a higher percentage of free yttrium in the platinum enriched gamma phase and also in the "P" phase beneath the alumina layer due to this method and the free yttrium forms yttria to enhance the alumina bonding. Alternative methods of deposition of the MCrAlY bond coat include, but are not limited to, vacuum plasma spraying and superpolishing of the MCrAlY and electron beam deposition and peening of the MCrAlY.

EXAMPLE 7

Figure 6:
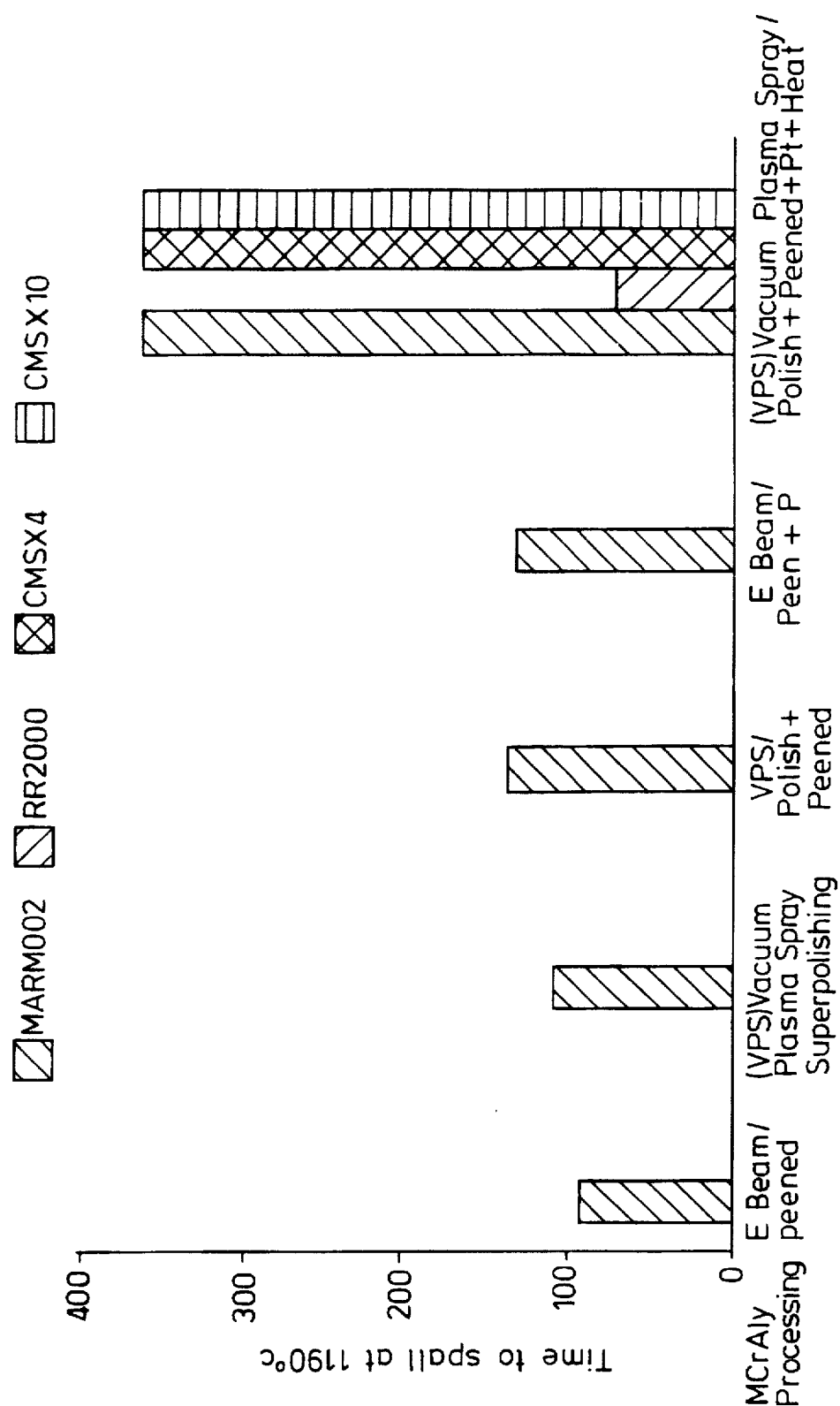
FIG. 6 is a bar chart showing the influence of the method of deposition of the MCrAlY coating on the performance of coatings according to the present invention.

In another experiment the effect of the method of depositing and processing of the MCrAlY was investigated and compared to MCrAlY bond coats without platinum. On top of one MAR-M 002 specimen a MCrAlY coating was deposited by electron beam deposition and was subsequently peened before the ceramic top coat was deposited. On another MAR-M 002 specimen a MCrAlY coating was deposited by vacuum plasma spraying and was subsequently superpolished before the ceramic top coat was deposited and on a further MAR-M 002 specimen a MCrAlY coating was deposited by vacuum plasma spraying and was subsequently polished and peened before the ceramic top coat was deposited. On another MAR-M 002 specimen a MCrAlY coating was deposited by electron beam deposition and was subsequently peened before being plated with platinum, heat treated and covered with a ceramic top coat. On specimens of MAR-M 002, RR2000, CMSX4 and CMSX10 MCrAlY coatings were deposited by vacuum plasma spraying and were subsequently polished and peened before being plated with platinum and heat treated and covered with ceramic top coats. These specimens were cyclically heated to 1190° C. and maintained at 1190° C. for one hour and then cooled to room temperature. The time taken for these coatings to spall at 1190° C. is shown in FIG. 6, and this indicates that for the MCrAlY bond coatings the vacuum plasma spraying, polishing and peening produces the best result. Similarly for the MCrAlY bond coats with platinum diffused into the bond coats, the vacuum plasma spraying, polishing and peening produces the best result.

Also of significance is the fact that the thermal barrier coating of the invention does not adhere to the RR2000 alloy as well as it does to the other alloys. This is due to the high level of titanium, 4 wt%, in the RR2000 alloy. This also indicates the superiority of the thermal barrier coatings of the present invention relative to the thermal barrier coatings with a conventional MCrAlY bond coat. Note that the thermal barrier coating of the present invention, as applied to MAR-M 002, CMSX4 and CMSX10, have survived over 350 hours in this test and are still intact.

Whereas in the above Examples 2, 4 and 6, only platinum was diffused into the outer layer of the alloy bond coat, other platinum group metals could be substituted, such as palladium or rhodium.

EXAMPLE 8

Figure 7:
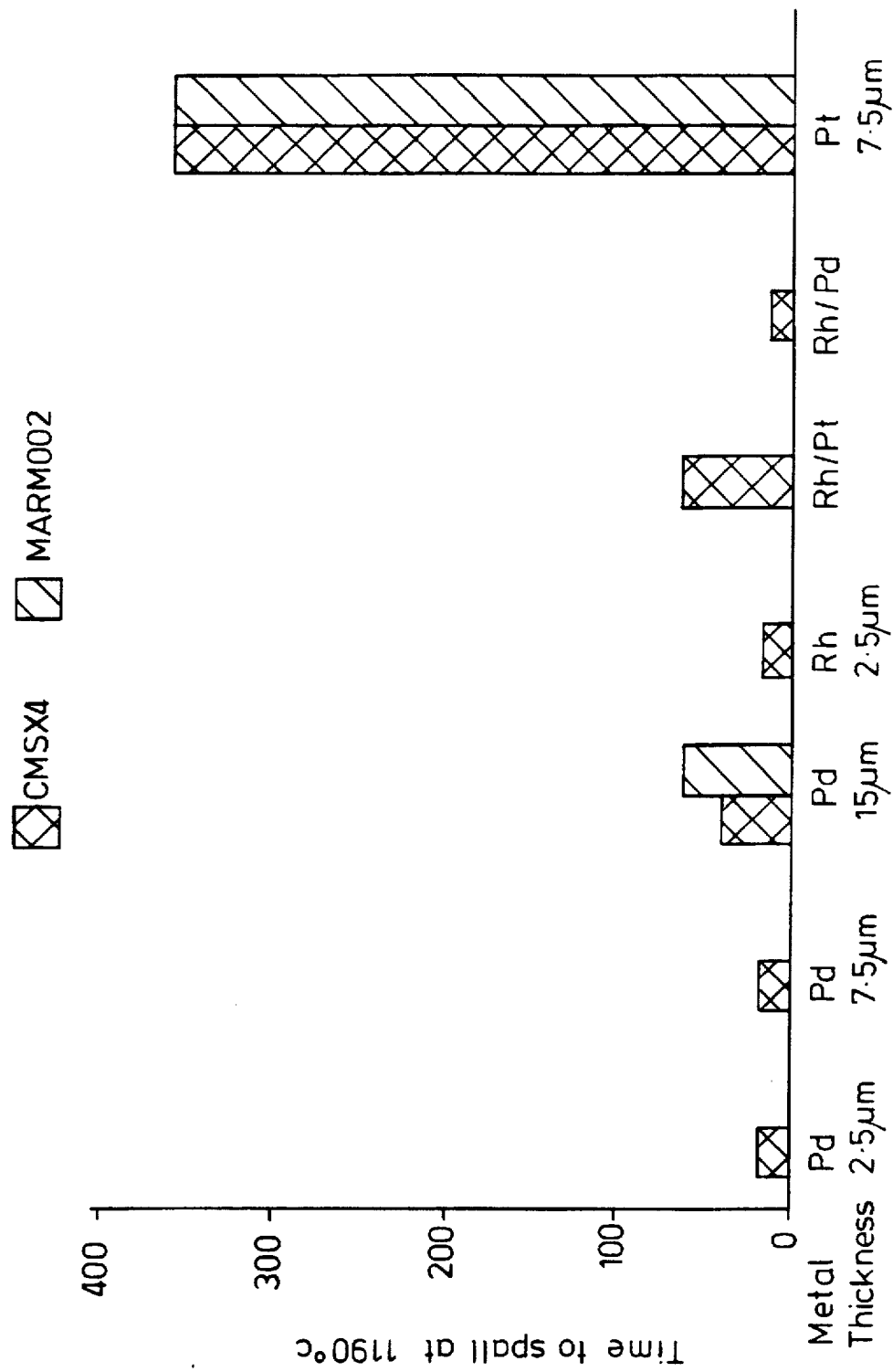
FIG. 7 is a bar chart showing the influence of different metals in the platinum-group of metals on the performance of coatings according to the present invention.

In a further experiment the effect of the different platinum-group metals was investigated. On top of specimens of CMSX4 with MCrAlY coatings different thicknesses of palladium were deposited at 2.5 microns, 7.5 microns and 15 microns respectively, also 2.5 microns of rhodium and 5 microns of platinum and a mixture of rhodium and platinum, 2.5 microns of rhodium and 5 microns of palladium. These were heat Treated at the same temperature as the previous examples and alumina and ceramic were deposited on them. Thereafter the specimens were cyclically heated to 1190° C. and maintained at 1190° C. for one hour and then cooled to room temperature. The time taken for these coatings to spall at 1190° C. is shown in FIG. 7, and this indicates that the platinum coating gives the best performance.

EXAMPLE 9

Figure 8:
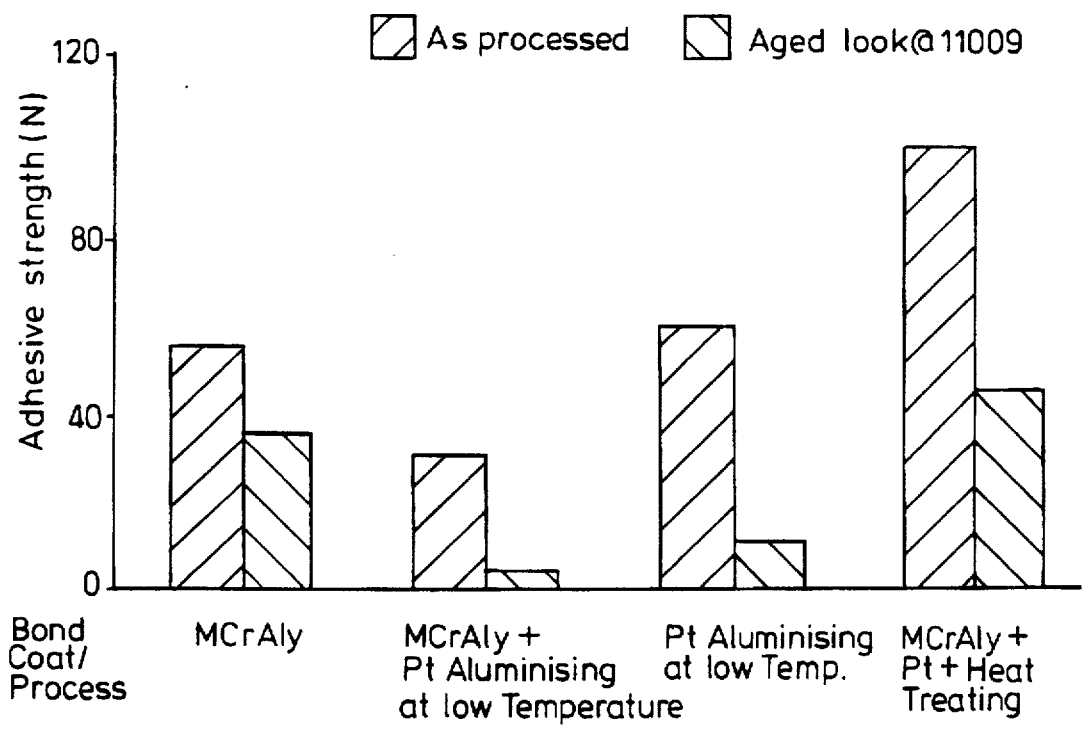
FIG. 8 is a bar chart comparing relative performance of four different coating types.

In another experiment specimens of MAR-M 002 were coated with MCrAlY and then ceramic as in Example 1. Other specimens of MAR-M 002 coated with MCrAlY, were then plated with platinum, aluminized at low temperature, 800° C. to 950° C., and then coated with ceramic. Another set of specimens of MAR-M 002 were plated with platinum, aluminized at low temperature, 800° C. to 950° C., and then coated with ceramic. The last set of specimens of MAR-M 002 were coated with MCrAlY, plated with platinum, heat treated at 1100° C. to 1200° C. and coated with ceramic as in Example 2. The specimens were then tested to determine their adhesive strength, critical load, and the results are shown in FIG. 8. The results show that the thermal barrier coating of the present invention is better than thermal barrier coatings using MCrAlY bond coatings, MCrAlY with platinum aluminide bond coatings produced by platinum aluminizing and platinum aluminide bond coatings produced by platinum aluminizing. Platinum aluminizing the MCrAlY mentioned above forms a beta phase which is rich in (Pt,Co,Ni)Al and has much higher aluminum levels than that observed in the "P" phase produced in the present invention, also the platinum aluminide contains harmful elements introduced from the aluminizing pack, such as sulphur etc. It is theorized that the beta phase is not as stable as the "P" phase and the beta phase breaks down to gamma and gamma prime phases more easily than the "P" phase. The beta phase and the "P" phase have different crystal structures and it is theorized that it is the crystal structure which determines the diffusion of elements through the phases, with the "P" phase blocking the diffusion of transition metal elements.

Although MAR-M 002 has been mentioned as an example of a superalloy substrate to which the coatings of the present invention can be successfully applied, the invention should not be considered restricted to use in conjunction with this specific alloy. For instance, the coating has been successfully tested on a substrate of a nickel-based alloy used for production of single crystal turbine blades, this alloy being known as CMSX 4, produced by the Cannon-Muskegon Corporation of 2875 Lincoln Street, Muskegon, Mich. 49443-0506, U.S.A. This alloy has a nominal composition as shown in Table 3.

TABLE 3

| ELEMENT | WEIGHT % |
| --- | --- |
| Tungsten | 6.4 |
| Cobalt | 9.5 |
| Chromium | 6.5 |
| Rhenium | 3.0 |
| Aluminum | 5.6 |
| Tantalum | 6.5 |
| Titanium | 1.0 |
| Hafnium | 0.1 |
| Molybdenum | 0.6 |
| Carbon | 0.006 |
| Nickel | Balance |

The coating has also been successfully applied on a substrate of a nickel based alloy used for production of single crystal blades, known as CMSX10, also produced by Cannon-Muskegon Corporation. This alloy has a nominal composition as shown in Table 4.

TABLE 4

| ELEMENT | WEIGHT % |
| --- | --- |
| Tungsten | 5.5 |
| Cobalt | 3.3 |
| Chromium | 2.2 |
| Rhenium | 6.2 |
| Aluminum | 5.8 |
| Tantalum | 8.3 |
| Titanium | 0.2 |
| Molybdenum | 0.4 |
| Niobium | 0.1 |
| Nickel | Balance |

The coating has also been successfully applied on a substrate of a nickel based alloy used for production of single crystal blades, known as RR2000, produced by Rolls-Royce plc. This alloy has a nominal composition as shown in Table 5.

TABLE 5

| ELEMENT | WEIGHT % |
| --- | --- |
| Cobalt | 15 |
| Chromium | 10 |
| Aluminum | 5.5 |
| Titanium | 4 |
| Molybdenum | 3 |
| Vanadium | 1 |
| Carbon | 0.015 |
| Nickel | Balance |

There is no reason to suppose that the invention could not also be successfully applied to cobalt-based superalloys.

Where the multi-layer coating of the present invention is applied to turbine blades or any other components, the precise thickness of each layer will be decided by experiment and/or calculation and will depend upon the temperature and corrosive agents to be experienced by the components during operation.

We claim:

1. A multi-layer thermal barrier coated article, comprising:

a superalloy substrate, an aluminum-containing alloy bond coat on the substrate, the aluminum-containing alloy bond coat having a platinum-group metal enriched outer layer, the outer layer being enriched with platinum-group metal relative to an inner portion of the aluminum-containing alloy bond coat, the platinum-group metal enriched outer layer of the aluminum-containing alloy bond coat having a surface layer predominantly comprising a continuous layer of at least one platinum-group metal aluminide, an adherent oxide layer comprising alumina and covering the platinum-group metal aluminide surface layer of the bond coat, and an insulating ceramic coating covering the oxide layer, wherein the completed coated article has yet to be subjected to thermal stress.

2. A thermal barrier coated article as claimed in claim 1, wherein the aluminum content of the bond coating is in the range 5% to 40% by weight.

3. A thermal barrier coated article as claimed in claim 1, wherein the aluminum-containing alloy bond coating is selected from the group consisting of nickel aluminide and cobalt aluminide.

4. A thermal barrier coated article as claimed in claim 1, wherein the aluminum-containing alloy bond coating comprises an MCrAlY alloy, where M is at least one of Ni, Co and Fe.

5. A thermal barrier coated article as claimed in claim 1, wherein the platinum-group metal enriched outer layer of the aluminum-containing alloy bond coated article is enriched with platinum and the surface layer of at least one platinum-group metal aluminide predominantly comprises platinum aluminide.

6. A thermal barrier coated article as claimed in claim 1, wherein the oxide layer comprises at least 70% by volume of alumina.

7. A thermal barrier coated article as claimed in claim 6, wherein the oxide layer comprises at least 90 vol. % of alumina.

8. A thermal barrier coated article as claimed in claim 7, wherein the oxide layer comprises at least 95 vol. % of alumina.

9. A thermal barrier coated article as claimed in claim 1, wherein the ceramic coating comprises yttria stabilized zirconia.

10. A thermal barrier coated article as claimed in claim 1, wherein the ceramic coating has a columnar structure.

11. A thermal barrier coated article as claimed in claim 1, wherein the superalloy substrate comprises a nickel based superalloy.

12. A thermal barrier coated article as claimed in claim 1, wherein the superalloy substrate comprises a cobalt based superalloy.

13. A thermal barrier coated article as claimed in claim 5, wherein the surface layer of platinum aluminide contains at least 25 wt % platinum and at least 8 wt % aluminum.

14. A thermal barrier coated article as claimed in claim 13 wherein the surface layer of platinum aluminide contains at least 40 wt % platinum.

15. A thermal barrier coated article as claimed in claim 14 wherein the surface layer of platinum aluminide contains at least 50 wt % platinum.

16. A thermal barrier coated article as claimed in claim 13, wherein the surface layer of platinum aluminide contains at least 10 wt % aluminum.

17. A thermal barrier coated article as claimed in claim 1, wherein the bond coating comprises a platinum-group metal enriched gamma phase layer overlying the layer of at least one platinum-group metal aluminide, and the adherent oxide layer comprising alumina overlies the platinum-group metal enriched gamma phase layer.

18. A thermal barrier coated article as claimed in claim 1, wherein the layer of at least one platinum-group metal aluminide contains yttrium.

19. A thermal barrier coated article as claimed in claim 17, wherein the layer of platinum-group metal enriched gamma phase contains yttrium.

20. A thermal barrier coated article as claimed in claim 13 wherein the layer of platinum aluminide contains 29–60 wt % platinum, 15–35 wt % nickel, 8–17 wt % cobalt, 9–15 wt % aluminum, 4.5–7.5 wt % chromium and 0–1 wt % yttrium.

21. A thermal barrier coated article as claimed in claim 1, wherein the adherent oxide layer is sufficiently coherent to prevent diffusion of oxygen through the ceramic coating into the bond coating.

22. A thermal barrier coated article as claimed in claim 1, wherein the continuous layer of at least one platinum-group metal aluminide comprises 15 wt % or less of aluminum.

23. A thermal barrier coated article as claimed in claim 1, wherein the surface layer comprises a platinum enriched gamma phase layer overlying a "P" phase platinum aluminide layer.

24. A multi-layer thermal barrier coated article, comprising:

a superalloy substrate, a bond coated article on the superalloy substrate, the bond coated article comprising an aluminum-containing alloy coated article, a platinum-group metal enriched aluminum-containing alloy layer and a coated article predominantly comprising a continuous layer of at least one platinum-group metal aluminide, the platinum-group metal enriched aluminum-containing alloy layer being enriched with platinum-group metal relative to the aluminum-containing alloy coating, the aluminum-containing alloy coating overlying the superalloy substrate, the platinum-group metal enriched aluminum-containing alloy layer overlying the aluminum-containing alloy coating and the coating of at least one platinum-group metal aluminide overlying the platinum-group metal enriched aluminum-containing alloy layer, an adherent oxide layer overlying the bond coating, the adherent oxide layer overlying the coating of at least one platinum-group metal aluminide, the adherent oxide layer comprising alumina without other spinels in amounts sufficient to substantially disrupt the alumina lattice structure, and a ceramic insulating coating on the adherent oxide layer, wherein the platinum-group metal enriched aluminum-containing alloy layer and the coating of at least one platinum-group metal aluminide reduce migration of transition metal elements through the bond coating to the ceramic coating, and wherein the completed coated article has yet to be subjected to thermal stress.

25. A multi-layer thermal barrier coated article as claimed in claim 24, wherein the adherent oxide layer is sufficiently coherent to prevent diffusion of oxygen through the ceramic insulating coated article into the bond coating.

* * * * *